United States Patent
Otani et al.

(10) Patent No.: US 10,814,725 B2
(45) Date of Patent: Oct. 27, 2020

(54) VEHICLE CONTROLLER AND ELECTRIC VEHICLE

(71) Applicants: Kabushiki Kaisha Toshiba, Minato-ku (JP); Toshiba Infrastructure Systems & Solutions Corporation, Kawasaki-shi (JP)

(72) Inventors: Hiroaki Otani, Fuchu (JP); Tomoyuki Makino, Iruma (JP)

(73) Assignees: Kabushiki Kaisha Toshiba, Minato-ku (JP); Toshiba Infrastructure Systems & Solutions Corporation, Kawasaki-shi (JP)

( * ) Notice: Subject to any disclaimer, the term of this patent is extended or adjusted under 35 U.S.C. 154(b) by 150 days.

(21) Appl. No.: 16/201,348

(22) Filed: Nov. 27, 2018

(65) Prior Publication Data

US 2019/0168614 A1 Jun. 6, 2019

(30) Foreign Application Priority Data

Dec. 4, 2017 (JP) .................................. 2017-232545

(51) Int. Cl.
*B60L 3/00* (2019.01)
*H05K 5/00* (2006.01)
(Continued)

(52) U.S. Cl.
CPC ............ *B60L 3/0023* (2013.01); *G01K 1/026* (2013.01); *G01K 3/005* (2013.01); *H02P 29/027* (2013.01);
(Continued)

(58) Field of Classification Search
CPC ............... B60L 3/0023; B60L 2210/40; B60L 2200/26; B60L 5/18; B60L 3/00;
(Continued)

(56) References Cited

U.S. PATENT DOCUMENTS 10,259,446 B1 * 4/2019 Shimizu .................. B60L 50/61
2010/0038962 A1 * 2/2010 Komatsu ................. B60L 58/18
307/10.1

(Continued)

FOREIGN PATENT DOCUMENTS

| CN | 103529348 B | 8/2016 |
|----|-------------|--------|
| JP | 2000-188801 | 7/2000 |
| TW | 201540572 A | 11/2015 |

*Primary Examiner* — Jared Fureman
*Assistant Examiner* — Michael J Warmflesh
(74) *Attorney, Agent, or Firm* — Oblon, McClelland, Maier & Neustadt, L.L.P.

(57) ABSTRACT

According to one embodiment, a vehicle controller includes an electric power converter, a plurality of first electric power transmission members, a temperature sensor, and a first controller. The electric power converter converts input electric power and outputs the converted electric power. The plurality of first electric power transmission members transmit the input electric power and are connected in parallel to the electric power converter. The temperature sensor is connected to at least one of the plurality of first electric power transmission members. The first controller determines that at least one of the plurality of first electric power transmission members is disconnected when a temperature detected by the temperature sensor changes.

20 Claims, 5 Drawing Sheets

(51) Int. Cl.
*H05K 5/02* (2006.01)
*G01K 1/02* (2006.01)
*G01K 3/00* (2006.01)
*H02P 29/024* (2016.01)
*H02P 27/06* (2006.01)

(52) U.S. Cl.
CPC ....... *H02P 29/0243* (2016.02); *H05K 5/0017* (2013.01); *H05K 5/0247* (2013.01); *B60L 2200/26* (2013.01); *B60L 2210/40* (2013.01); *H02P 27/06* (2013.01)

(58) Field of Classification Search
CPC ...... B60L 9/00; H02P 29/0243; H02P 29/027; H02P 27/06; H05K 5/0017; H05K 5/0247; G01K 1/026; G01K 3/005
See application file for complete search history.

(56) References Cited

U.S. PATENT DOCUMENTS

| | | | |
|---|---|---|---|
| 2010/0131137 A1* | 5/2010 | Iida | G01R 31/396 701/22 |
| 2010/0207587 A1* | 8/2010 | Oyobe | H02J 7/0063 320/152 |
| 2011/0030574 A1* | 2/2011 | Kitanaka | B60M 1/36 105/49 |
| 2015/0008674 A1* | 1/2015 | Hatanaka | B60L 3/0061 290/45 |
| 2015/0175007 A1* | 6/2015 | Matsumoto | H02M 5/458 701/22 |
| 2015/0343906 A1* | 12/2015 | Hatanaka | B60L 9/16 307/9.1 |
| 2017/0124783 A1* | 5/2017 | Alm | B60L 7/14 |
| 2017/0129339 A1* | 5/2017 | Krammer | B60L 3/0023 |
| 2017/0174099 A1* | 6/2017 | Kikkawa | B60M 1/12 |

* cited by examiner

VEHICLE CONTROLLER AND ELECTRIC VEHICLE

CROSS-REFERENCE TO RELATED APPLICATION

This application claims priority from Japanese Patent Application No. 2017-232545 filed on Dec. 4, 2017, the contents of which are incorporated herein by reference in their entirety.

FIELD

Embodiments described herein relate generally to a vehicle controller and an electric vehicle.

BACKGROUND

Generally, in a vehicle controller for an electric vehicle or the like, electrical wires having a large diameter are used for an input line and an output line (electric power transmission members) for a main circuit of an electric power converter or the like.

This is because the electric power of a motor driven by the vehicle controller is large, and it is necessary for a large amount of current to flow. The larger an amount of current flowing, the larger a diameter of the electrical wire, and thus a larger space is needed to bend the electrical wire. Therefore, there are cases in which one electrical wire having a large diameter is divided into a plurality of electrical wires having a small diameter to reduce a current flowing per electrical wire.

Also, when a conductor is used in place of an electrical wire, there are cases in which a plurality of conductors are connected in parallel to a main circuit for use in the vehicle control system in order to avoid generation of heat from the conductors due to the skin effect.

In the above-described vehicle controller, even when one of the plurality of electrical wires is disconnected, the remaining electrical wires are not disconnected and allow an electric current to flow therethrough. Therefore, even when any one of the electrical wires is disconnected, the vehicle controller does not stop immediately, and it is difficult to detect disconnection of the electrical wires.

DETAILED DESCRIPTION

According to one embodiment, a vehicle controller includes an electric power converter, a plurality of first electric power transmission members, a temperature sensor, and a first controller. The electric power converter converts input electric power and outputs the converted electric power. The plurality of first electric power transmission members transmit the input electric power and are connected in parallel to the electric power converter. The temperature sensor is connected to at least one of the plurality of first electric power transmission members. The first controller determines that at least one of the plurality of first electric power transmission members is disconnected when a temperature detected by the temperature sensor changes.

Hereinafter, a vehicle controller and an electric vehicle of embodiments will be described with reference to the drawings.

First Embodiment

Hereinafter, a first embodiment of an electric vehicle in a case in which the electric vehicle is a railway vehicle will be described with reference to FIGS. 1 to 4.

Figure 1:
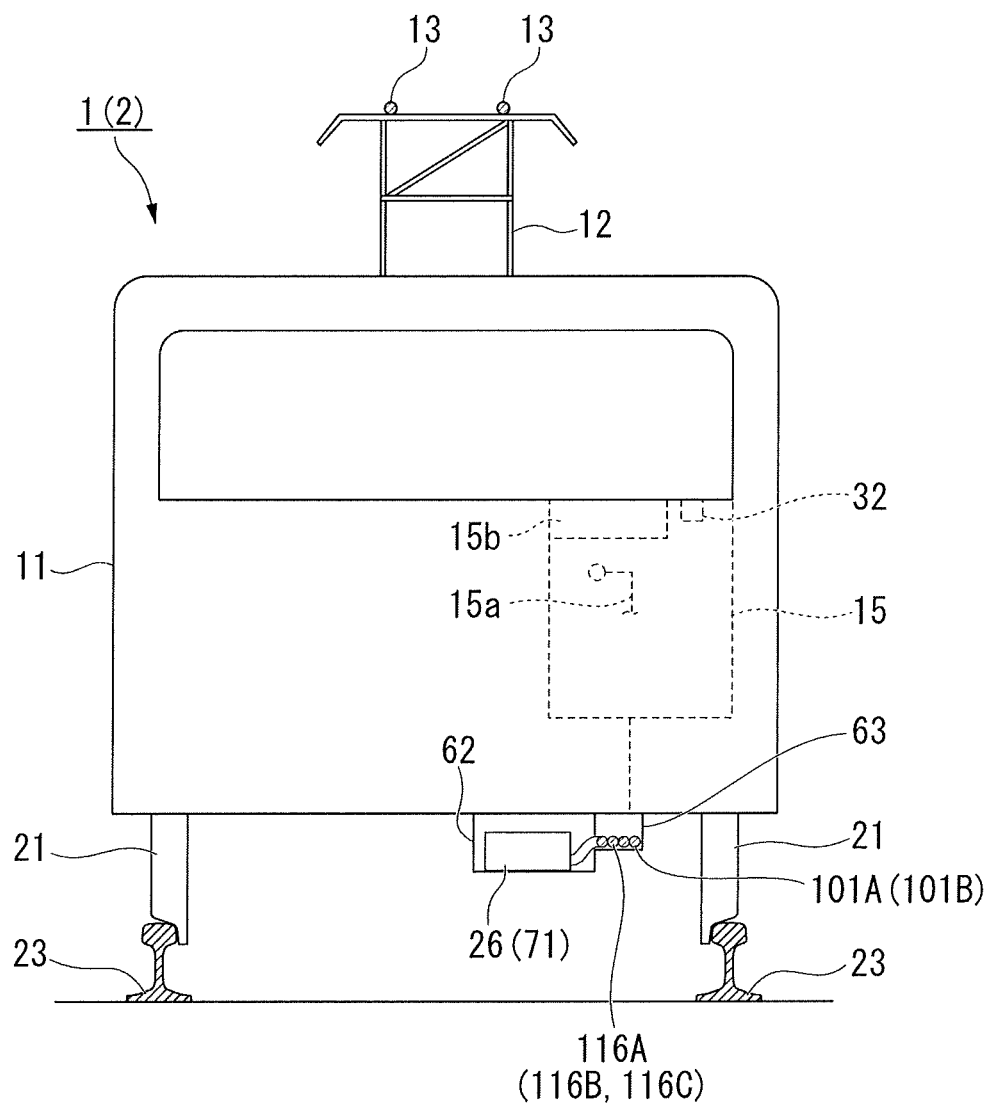
FIG. 1 is a front view showing a railway vehicle of a first embodiment.

As shown in FIG. 1, a railway vehicle 1 of the present embodiment includes a vehicle body 11, wheels 21, and a vehicle controller 26.

The vehicle body 11 is formed in a rectangular parallelepiped shape elongated in a direction perpendicular to a display surface shown in FIG. 1. A space capable of accommodating passengers is formed inside the vehicle body 11. On a top surface of the vehicle body 11, a pantograph 12 is provided facing upward. The pantograph 12 is disposed such that the pantograph 12 can come into contact with an overhead line 13 from below the overhead line 13.

A cab 15 is provided at an end portion in a longitudinal direction of the vehicle body 11. The cab 15 includes a lever 15a and a display 15b. The lever 15a is used for giving an instruction for acceleration or deceleration regarding a traveling speed of the railway vehicle 1. The display 15b displays a speed at which the railway vehicle 1 is traveling, and a warning lamp.

The wheels 21 are disposed with a space therebetween in a width direction of the vehicle body 11. Although not shown in detail, each of the wheels 21 is rotatably attached to a truck. The truck is fixed to a lower surface of the vehicle body 11 via a truck spring. A rotation speed of the respective wheels 21 is increased by a motor 22 shown in FIG. 2 that is attached to the vehicle body 11. The motor 22 is driven by the vehicle controller 26. Three input contacts 22A, 22B, and 22C for inputting a three-phase alternating current (AC) are provided in the motor 22.

A rotation speed of the respective wheels 21 is reduced by a brake (not illustrated). The motor 22 and the brake are operated by the lever 15a.

Each wheel 21 is disposed on a rail 23 shown in FIG. 1.

Figure 2:
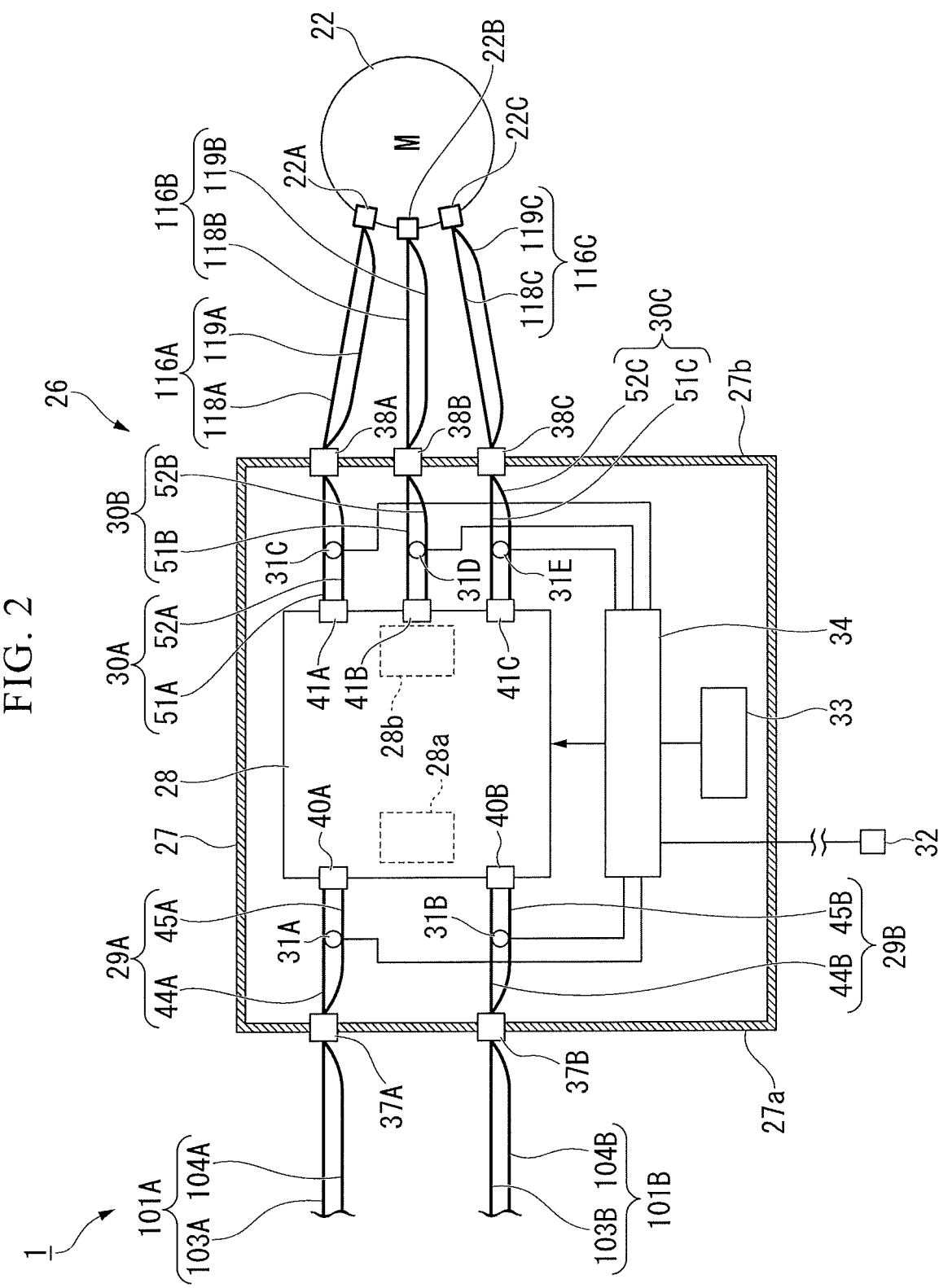
FIG. 2 is a plan view showing a vehicle controller of the railway vehicle of the first embodiment.

As shown in FIG. 2, the vehicle controller 26 includes a housing case 27, an electric power converter 28, a plurality of first input group cables 29, a plurality of first output group cables 30, a temperature sensor 31, a speaker (warning unit) 32, a storage 33, and a unit controller (first controller) 34.

Further, when referring to a first input group cable 29A, a first input group cable 29B, and the like without distinguishing them from each other, they are collectively referred to as the first input group cables 29. The same applies to the first output group cables 30, the temperature sensors 31, or the like. Also in the drawings, only the first input group cable 29A will be displayed, without the first input group cables 29 being displayed.

For example, the housing case 27 is formed in a box shape. The housing case 27 includes side walls 27a and 27b disposed to face each other.

A plurality of input contacts 37 are provided on the side wall 27a. Corresponding to the number of the plurality of first input group cables 29, two input contacts 37 are provided. Hereinafter, when this plurality of input contacts 37 are distinguished for indicating them individually, they will be referred to as an input contact 37A and an input contact 37B. The plurality of input contacts 37A and 37B are disposed side by side along the side wall 27a with a space therebetween.

A plurality of output contacts 38 are provided on the side wall 27b. Corresponding to the number of the plurality of first output group cables 30, three output contacts 38 are provided. Hereinafter, when this plurality of output contacts 38 are distinguished for indicating them individually, they will be referred to as an output contact 38A, an output contact 38B, and an output contact 38C. The plurality of output contacts 38A, 38B, and 38C are disposed side by side along the side wall 27b with spaces therebetween.

The electric power converter 28 is a known device having, for example, a converter, an inverter, and the like. The electric power converter 28 converts electric power of an input single-phase AC into electric power of a three-phase AC. In this example, the electric power converter 28 includes a current detector 28a and a current detector 28b.

The current detector 28a detects a current value of a single-phase AC current flowing through the plurality of first input group cables 29 and flowing into the electric power converter 28. The current detector 28b detects a current value of a three-phase AC current flowing from the electric power converter 28 and flowing through the plurality of first output group cables 30. The current detectors 28a and 28b send detection results to the storage 33 and the unit controller 34.

The electric power converter 28, the storage 33, and the unit controller 34 are disposed in the housing case 27.

A plurality of input contacts 40 are provided on an edge portion of the electric power converter 28 corresponding to the side wall 27a of the housing case 27. Corresponding to the number of the plurality of first input group cables 29, two input contacts 40 are provided. Hereinafter, when this plurality of input contacts 40 are distinguished for indicating them individually, they will be referred to as an input contact 40A, and an input contact 40B. The plurality of input contacts 40A and 40B are disposed side by side along the edge portion of the electric power converter 28 with a space therebetween.

A plurality of output contacts 41 are provided on an edge portion of the electric power converter 28 corresponding to the side wall 27b of the housing case 27. Corresponding to the number of the plurality of first output group cables 30, three output contacts 41 are provided. Hereinafter, when this plurality of output contacts 41 are distinguished for indicating them individually, they will be referred to as an output contact 41A, an output contact 41B, and an output contact 41C. The plurality of output contacts 41A, 41B, and 41C are disposed side by side along the edge portion of the electric power converter 28 with a space therebetween.

The electric power converter 28 converts electric power input from the plurality of input contacts 40 and outputs the converted electric power from the plurality of output contacts 41.

In the present embodiment, two first input group cables 29 are provided as the plurality of first input group cables 29, but the number thereof is not limited as long as there are a plurality of first input group cables 29.

Hereinafter, when the two first input group cables 29 are distinguished for indicating them individually, they will be referred to as the first input group cable 29A and the first input group cable 29B. A configuration of the first input group cable 29A and a configuration of the first input group cable 29B are the same. Thus, the configuration of the first input group cable 29A is denoted by adding a capital letter "A" to a numeral, or a numeral and a lower-case letter. A configuration of the first input group cable 29B corresponding to the first input group cable 29A is denoted by adding a capital letter "B" to the same numeral, or the same numeral and a lower-case letter as in the first input group cable 29A. Therefore, duplicated description will be omitted.

The same applies to first output group cables 30A, 30B, and 30C, second input group cables 101A and 101B, second output group cables 116A, 116B, and 116C, and the like to be described below.

The first input group cable 29A includes a first input cable 44A and a second input cable 45A. Similarly, the first input group cable 29B includes a first input cable 44B and a second input cable 45B.

Figure 3:
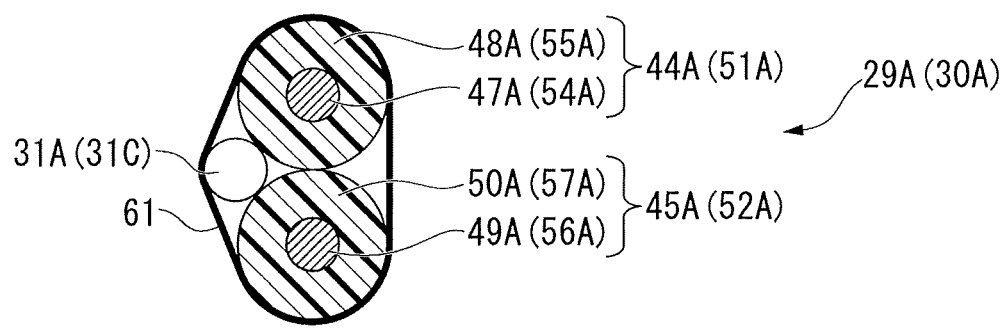
FIG. 3 is a cross-sectional view showing a first input group cable of the railway vehicle of the first embodiment.

As shown in FIG. 3, the first input cable 44A includes a first input electrical wire (first electric power transmission member) 47A and a first input insulating sheath 48A. For example, the first input electrical wire 47A is formed of a single copper wire, a twisted wire, or the like. The first input insulating sheath 48A is formed of an electrically insulating material such as polyethylene resin. The first input insulating sheath 48A covers an outer circumferential surface of the first input electrical wire 47A.

Similarly, the second input cable 45A includes a first input electrical wire (first electric power transmission member) 49A and a first input insulating sheath 50A.

As shown in FIG. 2, a first end portion of the first input electrical wire 47A of the first input cable 44A and a first end portion of a first input electrical wire 49A of the second input cable 45A are individually connected to the input contact 37A of the housing case 27. A second end portion of the first input electrical wire 47A of the first input cable 44A and a second end portion of the first input electrical wire 49A of the second input cable 45A are individually connected to the input contact 40A of the electric power converter 28.

Similarly, a first input electrical wire (first electric power transmission member) of the first input cable 44B and a first input electrical wire (first electric power transmission member) of the second input cable 45B are connected to both the input contact 37B of the housing case 27 and the input contact 40B of the converter 28.

The first input group cables 29A and 29B are connected to the electric power converter 28 and transmit electric power input to the electric power converter 28.

The second input group cable 101A is connected to the input contact 37A of the housing case 27. Similarly, the second input group cable 101B is connected to the input contact 37B of the housing case 27.

The second input group cable 101A includes a third input cable 103A and a fourth input cable 104A. Similarly, the second input group cable 101B includes a third input cable 103B and a fourth input cable 104B.

Figure 4:
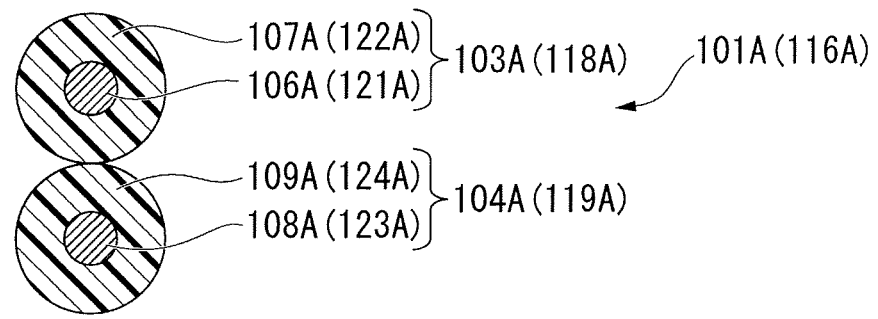
FIG. 4 is a cross-sectional view showing a second input group cable of the railway vehicle of the first embodiment.

As shown in FIG. 4, the third input cable 103A is configured similarly to the first input cable 44A, and includes a second input electrical wire (second electric power transmission member) 106A and a second input insulating sheath 107A. The fourth input cable 104A is configured similarly to the second input cable 45A, and includes a second input electrical wire (second electric power transmission member) 108A and a second input insulating sheath 109A.

As shown in FIG. 2, a first end portion of the second input electrical wire 106A of the third input cable 103A and a first end portion of the second input electrical wire 108A of the fourth input cable 104A are individually connected to the input contact 37A of the housing case 27. The second input electrical wires 106A and 108A are respectively connected to the first end portions of the first input electrical wires 47A and 49A different from the second end portions thereof connected to the electric power converter 28. The second input electrical wires 106A and 108A and the first input electrical wires 47A and 49A are connected in series.

A second end portion of the second input electrical wire 106A of the third input cable 103A and a second end portion of the second input electrical wire 108A of the fourth input cable 104A are each connected to the pantograph 12.

The third input cable 103B includes a second input electrical wire (second electric power transmission member) and a second input insulating sheath. The fourth input cable 104B includes a second input electrical wire (second electric power transmission member) and a second input insulating sheath.

A first end portion of the second input electrical wire of the third input cable 103B and a first end portion of the second input electrical wire of the fourth input cable 104B are individually connected to the input contact 37B of the housing case 27. A second end portion of the second input electrical wire of the third input cable 103B and a second end portion of the second input electrical wire of the fourth input cable 104B are each connected to the pantograph 12.

A single-phase AC transmitted from the overhead line 13 via the pantograph 12 is transmitted to the electric power converter 28 through the second input group cables 101A and 101B and the first input group cables 29A and 29B.

In the present embodiment, three first output group cables 30A, 30B, and 30C are provided as the plurality of first output group cables 30, but the number thereof is not limited as long as there are a plurality of first output group cables 30.

The first output group cable 30A includes a first output cable 51A and a second output cable 52A. Similarly, the first output group cable 30B includes a first output cable 51B and a second output cable 52B. The first output group cable 30C includes a first output cable 51C and a second output cable 52C.

As shown in FIG. 3, the first output cable 51A is configured similarly to the first input cable 44A, and includes a first output electrical wire (first electric power transmission member) 54A and a first output insulating sheath 55A. The second output cable 52A is configured similarly to the second input cable 45A, and includes a first output electrical wire (first electric power transmission member) 56A and a first output insulating sheath 57A.

As shown in FIG. 2, a first end portion of the first output electrical wire 54A of the first output cable 51A and a first end portion of the first output electrical wire 56A of the second output cable 52A are individually connected to the output contact 38A of the housing case 27. A second end portion of the first output electrical wire 54A of the first output cable 51A and a second end portion of the first output electrical wire 56A of the second output cable 52A are individually connected to the output contact 41A of the electric power converter 28.

Similarly, a first output electrical wire (first electric power transmission member) of the first output cable 51B and a first output electrical wire (first electric power transmission member) of the second output cable 52B are connected to both the output contact 38B of the housing case 27 and the output contact 41B of the electric power converter 28. A first output electrical wire (first electric power transmission member) of the first output cable 51C and a first output electrical wire (first electric power transmission member) of the second output cable 52C are connected to both the output contact 38C of the housing case 27 and the output contact 41C of the electric power converter 28.

The first output group cables 30A, 30B, and 30C are connected to the electric power converter 28 and transmit the electric power converted by the electric power converter 28.

The second output group cable 116A is connected to the output contact 38A of the housing case 27. Similarly, the second output group cable 116B is connected to the output contact 38B of the housing case 27. The second output group cable 116C is connected to the output contact 38C of the housing case 27.

The second output group cable 116A includes a third output cable 118A and a fourth output cable 119A. Similarly, the second output group cable 116B includes a third output cable 118B and a fourth output cable 119B. The second output group cable 116C includes a third output cable 118C and a fourth output cable 119C.

As shown in FIG. 4, the third output cable 118A is configured similarly to the third input cable 103A, and includes a second output electrical wire (second electric power transmission member) 121A and a second output insulating sheath 122A. The fourth output cable 119A is configured similarly to the fourth input cable 104A, and includes a second output electrical wire (second electric power transmission member) 123A and a second output insulating sheath 124A.

As shown in FIG. 2, a first end portion of the second output electrical wire 121A of the third output cable 118A and a first end portion of the second output electrical wire 123A of the fourth output cable 119A are individually connected to the output contact 38A of the housing case 27. The second output electrical wires 121A and 123A are respectively connected to the first end portions of the first output electrical wires 54A and 56A different from the second end portions thereof connected to the electric power converter 28. The second output electrical wires 121A and 123A and the first output electrical wires 54A and 56A are connected in series.

A second end portion of the second output electrical wire 121A of the third output cable 118A and a second end portion of the second output electrical wire 123A of the fourth output cable 119A are individually connected to an input contact 22A of the motor 22.

Similarly, the third output cable 118B includes a second output electrical wire (second electric power transmission member) and a second output insulating sheath. The fourth output cable 119B includes a second output electrical wire (second electric power transmission member) and a second output insulating sheath.

A first end portion of the second output electrical wire of the third output cable 118B and a first end portion of the second output electrical wire of the fourth output cable 119B are individually connected to the output contact 38B of the housing case 27. A second end portion of the second output electrical wire of the third output cable 118B and a second end portion of the second output electrical wire of the fourth output cable 119B are individually connected to an input contact 22B of the motor 22.

The third output cable 118C includes a second output electrical wire (second electric power transmission member) and a second output insulating sheath. The fourth output cable 119C includes a second output electrical wire (second electric power transmission member) and a second output insulating sheath.

A first end portion of the second output electrical wire of the third output cable 118C and a first end portion of the second output electrical wire of the fourth output cable 119C are individually connected to the output contact 38C of the housing case 27. A second end portion of the second output electrical wire of the third output cable 118C and a second end portion of the second output electrical wire of the fourth output cable 119C are individually connected to an input contact 22C of the motor 22.

In this example, a thermocouple is used for the temperature sensors 31. As shown in FIG. 2, the vehicle controller 26 includes a plurality of temperature sensors 31. Temperature sensors 31A, 31B, 31C, 31D, and 31E serving as the temperature sensors 31 are respectively attached to the first input group cables 29A and 29B, and the first output group cables 30A, 30B, and 30C.

Hereinafter, the temperature sensor 31A attached to the first input group cable 29A will be described with reference to FIG. 3. The temperature sensor 31A is attached to the input cables 44A and 45A using a fixing tool 61 such as a band or the like to be connected to both the first input insulating sheath 48A of the first input cable 44A and the first input insulating sheath 50A of the second input cable 45A. The temperature sensor 31A is connected to both the first input electrical wires 47A and 49A via the input insulating sheaths 48A and 50A. However, the temperature sensor 31A is not connected to the first input electrical wire of the first input group cable 29B. The term "connect" as used in the present specification means not only connecting something in direct contact without other members interposed, but also connecting something in indirect contact with other members interposed.

Further, the temperature sensor 31A may be in contact with the first input insulating sheaths 48A and 50A, or may be disposed at a position separated from the input insulating sheath 48A and 50A.

Similarly, as shown in FIG. 2, the temperature sensor 31B is connected to both the first input electrical wires of the first input group cable 29B via the first input insulating sheaths. However, the temperature sensor 31B is not connected to the first input electrical wires 47A and 49A of the first input group cable 29A.

The temperature sensors 31C, 31D, and 31E are respectively connected to the first output group cables 30A, 30B, and 30C. Each of the temperature sensors 31 sends detection results to the unit controller 34 and the storage 33.

The speaker 32 is provided in the cab 15 of the vehicle body 11 as shown in FIG. 1. The speaker 32 can warn a driver (operator) by generating a sound. The speaker 32 is connected to the unit controller 34 and is controlled by the unit controller 34.

The warning unit is assumed to be the speaker 32. However, the warning unit is not limited thereto, and the display 15b of the cab 15 may be used as the warning unit. In this case, the unit controller 34 warns the driver by displaying characters, figures, or the like on the display 15b or the like.

The storage 33 is configured to include a random-access memory (RAM) and the like. Predetermined a first temperature threshold value and a second temperature threshold value, control programs for controlling the unit controller 34, and the like are stored in the storage 33.

The first temperature threshold value is a threshold value indicating a degree of rapid temperature rise, and is, for example, 5° C. The second temperature threshold value is a threshold value indicating a sufficiently high temperature at which the group cables 29 and 30 are not normally used, and is, for example, approximately 100° C.

The unit controller 34 is configured to include a central processing unit (CPU) and the like. As shown in FIGS. 1 and 2, the unit controller 34 is connected to the electric power converter 28 and the storage 33, and controls the electric power converter 28 and the storage 33.

Details of control of the unit controller 34 will be described in detail in an operation of the railway vehicle 1 to be described below.

As shown in FIG. 1, for example, the vehicle controller 26 is fixed to a lower surface of the vehicle body 11 in a state of being supported by a support case 62. The second input group cables 101A and 101B, and the second output group cables 116A, 116B, and 116C are fixed to the lower surface of the vehicle body 11 in a state of being housed in an electrical wire holder 63.

Next, an operation of the railway vehicle 1 configured as described above will be described.

The electric power converter 28 converts a single-phase AC transmitted from the overhead line 13 via the pantograph 12, the second input group cables 101A and 101B, and the first input group cables 29A and 29B, into a three-phase AC.

The current detector 28a detects current values of currents flowing through the plurality of first input group cables 29. The current detector 28b detects current values of currents flowing through the plurality of first output group cables 30.

Each of the current detectors 28a and 28b periodically transmits detection results to the storage 33 and the unit controller 34. The transmitted current values are stored in the storage 33.

The three-phase AC converted by the electric power converter 28 is transmitted to the motor 22 through the first output group cables 30A, 30B, and 30C, and the second output group cables 116A, 116B, and 116C. The motor 22 transmits a driving force to each of the wheels 21.

Here, the number of the plurality of first input group cables 29 is assumed to be N. In the present embodiment, the value of N is two.

A current value of a current flowing through the whole of the plurality of first input group cables 29 is assumed to be I (A: ampere), and a resistance value of the first input electrical wires of each of the first input group cables 29 is assumed to be R (Ω: ohm).

When none of the first input electrical wires of the plurality of first input group cables 29 is disconnected, a current evenly flows through the first input electrical wires of the N first input group cables 29. A current value of the current flowing through the first input electrical wires of each of the first input group cables 29 is (I/N). In this case, an amount of heat generation by each of the first input group cables 29 is $Q_{o1}$ (W: watt hours) represented by Expression (1).

$$Q_{o1}=(I/N)^2R=(I^2R)/N^2 \qquad (1)$$

An amount of heat generation by the whole of the N first input group cables 29 is $Q_{oA}$(W) represented by Expression (2).

$$Q_{oA}=N\times(I^2R)/N^2=(I^2R)/N \qquad (2)$$

On the other hand, when one of the N first input group cables 29 is disconnected, a current evenly flows through the (N−1) first input group cables 29 which are not disconnected. A current value of the current flowing through each of the first input group cables 29 is {I/(N−1)}. In this case, an amount of heat generation by each of the first input group cables 29 is $Q_{11}$(W) represented by Expression (3).

$$Q_{11} = \{(I/(N-1)\}^2 R = (I^2 R)/(N-1)^2 \quad (3)$$

An amount of heat generation by the whole of the N first input group cables 29 is $Q_{1A}$(W) represented by Expression (4). However, heat is not generated from one of the first input group cables 29 that has been disconnected.

$$Q_{1A} = (N-1) \times (I^2 R)/(N-1)^2 = (I^2 R)/(N-1) \quad (4)$$

A ratio ($Q_{1A}/Q_{0A}$) of the heat generation amount of the whole of the N first input group cables 29 after disconnection to before disconnection is represented by Expression (5).

$$Q_{1A}/Q_{0A} = \{(I^2 R)/(N-1)\}/\{(I^2 R)/N\} = N/(N-1) \quad (5)$$

For example, when the number N of the plurality of first input group cables 29 is two as in the present embodiment, ($Q_{1A}/Q_{0A}$) is two from Expression (6).

$$2/(2-1) = 2 \quad (6)$$

When the number N of the plurality of first input group cables 29 is three, ($Q_{1A}/Q_{0A}$) is 1.5 from Expression (7).

$$3/(3-1) = 1.5 \quad (7)$$

This ratio between amounts of heat generation is similarly applied to the plurality of first output group cables 30 or the like. The smaller the number N of the plurality of group cables 29 or 30 is, the larger the ratio between amounts of heat generation when one of the first input group cables 29 is disconnected.

It can be assumed that the group cables 29, 30, and the like are not disconnected for a certain period of time from an operation start of the railway vehicle 1, and respective current values detected by the current detectors 28a and 28b stored in the storage 33 are the same regardless of the elapse of time. Here, the fact that the current values stored in the storage 33 are the same regardless of the elapse of time means that, for example, a ratio of a difference between a maximum value and a maximum value to a minimum current value stored in the storage 33 supplied to the current detector 28a is within 10%. This ratio is more preferably within 5%, and still more preferably within 3%. The same applies to the current detector 28b.

Regardless of the elapse of time means within any predetermined period of time, for example, 5 minutes.

At this time, for example, it is assumed that the first input electrical wire 47A of the first input group cable 29A is disconnected. A current flowing through the plurality of first input group cables 29 intensively flows through the first input group cable 29B. Since the plurality of first input group cables 29 have two first input group cables 29, a current value detected by the current detector 28a is the same regardless of the elapse of time. Therefore, an amount of heat generation of the first input group cable 29B becomes twice that before disconnection, and a temperature detected by the temperature sensor 31B rises from a temperature detected immediately before. An amount of heat generation by the first input group cable 29A disappears and a temperature detected by the temperature sensor 31A falls from a temperature detected immediately before.

When a temperature detected by the temperature sensor 31B has risen by the first temperature threshold value or more from the temperature detected immediately before, the unit controller 34 determines that at least one of the first input electrical wires 47A and 49A of the first input group cable 29A is disconnected. Further, when a temperature detected by the temperature sensor 31A has decreased by the first temperature threshold value or more from the temperature detected immediately before, the unit controller 34 may determine that at least one of the first input electrical wires 47A and 49A of the first input group cable 29A is disconnected.

At this time, the unit controller 34 may warn the driver by generating a sound with the speaker 32. The driver who notices the sound requests maintenance of the railway vehicle 1, for example, after the operation of the railway vehicle 1 has ended.

The person in charge of maintenance (hereinafter referred to as a mechanic) inspects the first input electrical wires 47A and 49A with a tester or the like and determines whether or not the first input electrical wire 47A is disconnected. When the first input electrical wire 47A turns out to be disconnected, the mechanic performs a repair such as replacing the first input cable 44A with a new first input cable 44A.

Also for the first output group cables 30A, 30B, and 30C, it is possible to detect whether or not at least one of the plurality of first output electrical wires is disconnected by the same method.

As described above, according to the vehicle controller 26 of the present embodiment, a current value detected by the current detector 28a is the same regardless of the elapse of time. When a temperature detected by the temperature sensor 31B has risen by the first temperature threshold value or more from a temperature detected immediately before, the unit controller 34 determines that at least one of the first input electrical wires 47A and 49A of the first input group cable 29A has been disconnected. Therefore, it can be detected whether or not at least one of the plurality of first input electrical wires of the first input group cables 29A and 29B has been disconnected.

The temperature sensor 31A is indirectly connected to both the first input electrical wires 47A and 49A of the first input group cable 29A and is not connected to the first input electrical wires of the first input group cable 29B.

Accordingly, the temperature sensor 31A is prevented from being influenced by the first input electrical wires of the first input group cable 29B, and thus it is possible to more reliably detect temperatures of the first input electrical wires 47A and 49A using the temperature sensor 31A.

The vehicle controller 26 includes the speaker 32. Therefore, when it is determined that the first input electrical wire 47A is disconnected, a warning can be issued to the driver by generating a sound.

Further, according to the railway vehicle 1 of the present embodiment, the railway vehicle 1 can be configured using the vehicle controller 26 which can detect whether or not at least one of the plurality of the first electrical wires of the first input group cables 29A and 29B is disconnected.

In the present embodiment, the unit controller 34 may determine that at least one of the plurality of first input electrical wires is disconnected when a temperature detected by the temperature sensor 31A changes.

Even with such a configuration, it is possible to detect whether or not at least one of the first input electrical wires 47A and 49A is disconnected.

Also for the first output group cables 30A, 30B, and 30C, it is possible to detect whether or not at least one of the plurality of first output electrical wires is disconnected by the same method.

Second Embodiment

Next, a second embodiment of an electric vehicle will be described with reference to FIGS. 1 and 5, but components the same as those in the above-described embodiment will be denoted by the same reference numerals, detailed description thereof will be omitted, and only different points will be described.

Figure 5:
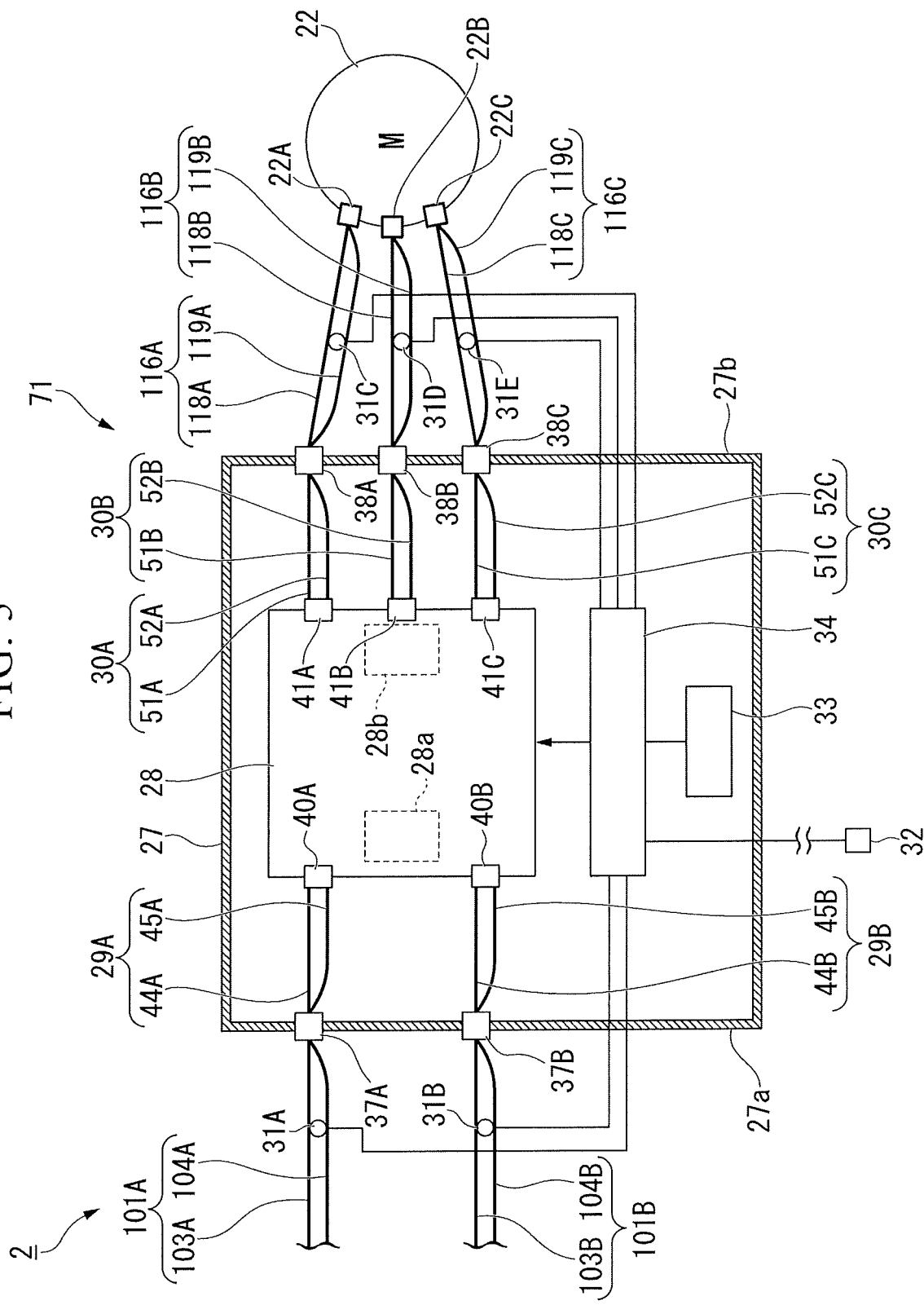
FIG. 5 is a plan view showing a vehicle controller of a railway vehicle of a second embodiment.

As shown in FIGS. 1 and 5, a railway vehicle 2 of the present embodiment includes a vehicle controller 71 of the present embodiment instead of the vehicle controller 26 of the railway vehicle 1 of the first embodiment.

In the vehicle controller 71, positions at which temperature sensors 31A to 31E are connected are different as compared with those in the vehicle controller 26.

The temperature sensor 31A is connected to both of second input electrical wires 106A and 108A via second input insulating sheaths 107A and 109A in a second input group cable 101A. Similarly, the temperature sensor 31B is connected to both of second input electrical wires of a second input group cable 101B via second input insulating sheaths. The temperature sensors 31C, 31D, and 31E are respectively connected to second output group cables 116A, 116B, and 116C.

Each of the temperature sensors 31 sends detection results to a unit controller 34 and a storage 33.

In the present embodiment, the unit controller 34 detects whether or not a plurality of second input electrical wires or the like of the second input group cables 101A and 101B are disconnected using the same process as in the first embodiment.

As described above, according to the vehicle controller 71 of the present embodiment, it is possible to detect whether or not at least one of the plurality of second input electrical wires of the second input group cables 101A and 101B is disconnected. It is also possible to detect whether or not at least one of a plurality of second output electrical wires of the second output group cables 116A, 116B, and 116C is disconnected.

The configuration of the vehicle controllers in the first and second embodiments can be modified in various ways as will be described below.

Figure 6:
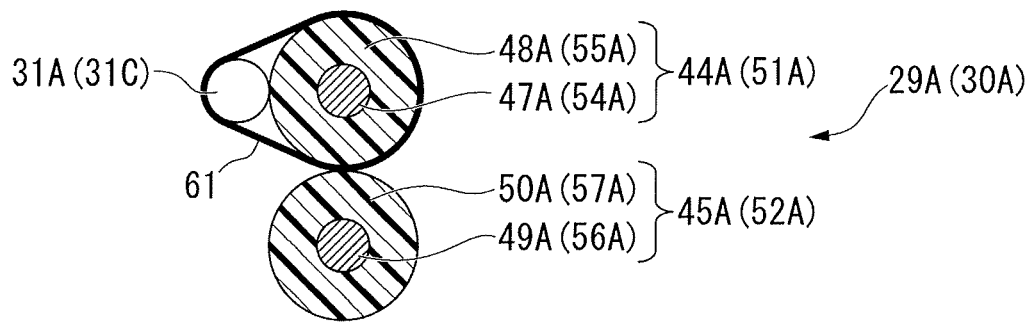
FIG. 6 is a cross-sectional view showing a first input group cable of a modified example of the embodiments.

As shown in FIG. 6, the temperature sensor 31A may have a configuration such that the temperature sensor 31A is connected to the first input electrical wire 47A via the input insulating sheath 48A but not connected to the first input electrical wire 49A. When the first input electrical wire 49A is disconnected, no current flows not only in the first input electrical wire 49A but also in the first input electrical wire 47A. Therefore, it is possible to detect whether or not at least one of the first input electrical wires 47A and 49A is disconnected by simply attaching the temperature sensor 31A to the first input cable 44A using the fixing tool 61.

Figure 7:
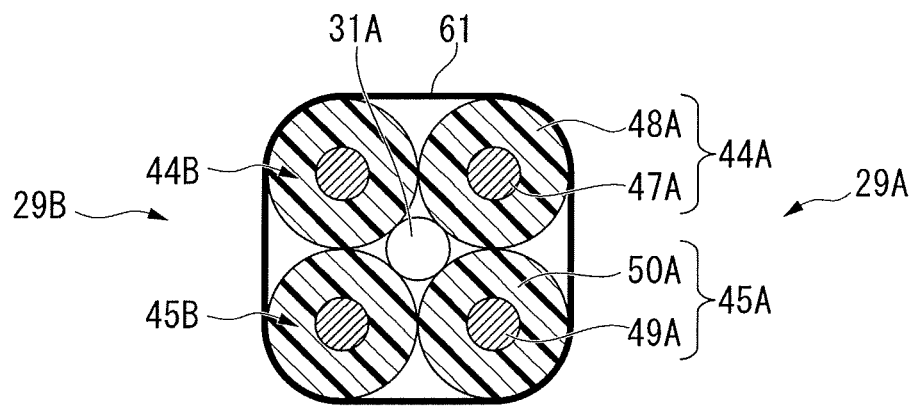
FIG. 7 is a cross-sectional view showing a first input group cable of a modified example of the embodiments.

The vehicle controller 26 may not include the temperature sensor 31B, and the temperature sensor 31A may be connected to all the first input electrical wires of the input cables 44A, 45A, 44B, and 45B via the input insulating sheaths as shown in FIG. 7. The input cables 44A, 45A, 44B, and 45B are disposed at equiangular intervals around the temperature sensor 31A.

Since the number N of the plurality of first input group cables 29 is two, an amount of heat generation is doubled after disconnection of the first input electrical wire as compared with that before disconnection thereof. Therefore, after the disconnection, the temperature detected by the temperature sensor 31A rises. Therefore, the unit controller 34 determines that at least one of the first input electrical wires of the input cables 44A, 45A, 44B, and 45B is disconnected.

Figure 8:
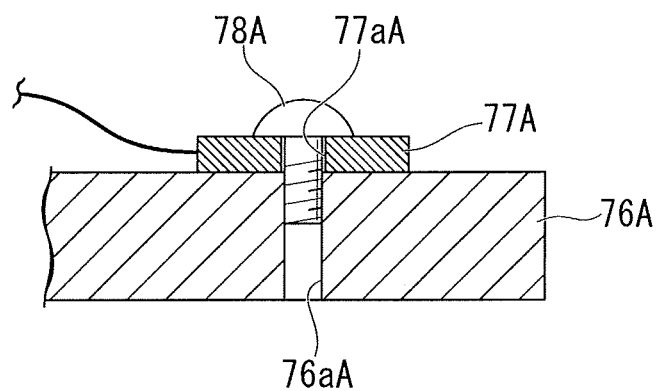
FIG. 8 is a cross-sectional view showing a conductor of a modified example of the embodiments.

As the first electric power transmission member, a conductor 76A shown in FIG. 8 may be used instead of the first input electrical wires 47A, 49A, or the like. The conductor 76A is not covered with an insulating sheath. In this case, it is preferable that a thermistor be used as a temperature sensor 77A.

For example, a female threaded portion 76aA is formed in the conductor 76A. A through-hole 77aA is formed in the temperature sensor 77A. When a screw 78A inserted in the through-hole 77aA is fitted into the female threaded portion 76aA, the temperature sensor 77A is attached to the conductor 76A.

The modified example described above also applies to the second embodiment.

When it is determined that at least one of the first input electrical wires 47A and 49A of the first input group cable 29A is disconnected, the unit controller 34 may stop electric power conversion by the electric power converter 28. Further, an upper limit value of the electric power converted per unit time by the electric power converter 28 may be lowered. With such a configuration, further occurrence of damage to the vehicle controller 26 can be inhibited.

Further, when a temperature detected by the temperature sensor 31A exceeds the second temperature threshold value, the unit controller 34 may determine that at least one of the first input electrical wires 47A and 49A is disconnected. In this manner, whether or not disconnection has occurred may be determined without comparing the temperature detected by the temperature sensor 31A with the temperature detected by the temperature sensor 31A and stored in the storage 33 as done so far. With such a configuration, the unit controller 34 can quickly make a determination.

The vehicle controller may not include the current detectors 28a and 28b, the speaker 32, and the storage 33.

The first input group cables 29, the first output group cables 30, the second input group cables 101, and the second output group cables 116 have each been assumed to be of a plural number. However, one of the first input group cables 29 and the second input group cables 101, and the first output group cables 30 and the second output group cables 116, may be singular and the other may be plural. In this case, the temperature sensors 31 need not be provided on the singular one.

The electric vehicle has been assumed to be a railway vehicle, but the electric vehicle is not limited thereto. The electric vehicle may be an electric automobile or the like.

According to at least one embodiment described above, it is possible to detect whether or not at least one of a plurality of first input electrical wires is disconnected by having the temperature sensors 31 and the unit controller 34.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A vehicle controller, comprising:
   an electric power converter converting input electric power and outputting the converted electric power;
   a plurality of first electric power transmission members transmitting the input electric power and connected in parallel to the electric power converter;
   a temperature sensor connected to at least one of the plurality of first electric power transmission members; and
   a first controller determining that at least one of the plurality of first electric power transmission members has been disconnected when a temperature detected by the temperature sensor changes.

2. The vehicle controller according to claim 1, further comprising:
   a current detector detecting a current value of a current flowing through the plurality of first electric power transmission members, and
   a storage storing a current value detected by the current detector and a predetermined first temperature threshold value, wherein
   when a current value stored in the storage is the same regardless of the elapse of time, the first controller determines that at least one of the plurality of first electric power transmission members has been disconnected when a temperature detected by the temperature sensor has changed by the first temperature threshold value or more from a temperature detected immediately before.

3. The vehicle controller according to claim 1, wherein the temperature sensor is connected to one first electric power transmission member of the plurality of first electric power transmission members and is not connected to the other first electric power transmission members.

4. The vehicle controller according to claim 1, wherein the temperature sensor is connected to each of the plurality of first electric power transmission members.

5. The vehicle controller according to claim 1, wherein the first controller stops conversion of the electric power by the electric power converter when it is determined that at least one of the plurality of first electric power transmission members has been disconnected.

6. The vehicle controller according to claim 1, wherein the first controller lowers an upper limit value of the electric power converted per unit time by the electric power converter when it is determined that at least one of the plurality of first electric power transmission members has been disconnected.

7. The vehicle controller according to claim 1, further comprising:
   a warning unit capable of warning an operator, wherein the first controller warns the operator using the warning unit when it is determined that at least one of the plurality of first electric power transmission members has been disconnected.

8. The vehicle controller according to claim 1, further comprising:
   a storage storing a predetermined second temperature threshold value, wherein
   the first controller determines that at least one of the plurality of first electric power transmission members has been disconnected when a temperature detected by the temperature sensor exceeds the second temperature threshold value.

9. An electric vehicle, comprising:
   the vehicle controller according to claim 1.

10. A vehicle controller, comprising:
    an electric power converter converting input electric power and outputting the converted electric power;
    a plurality of first electric power transmission members transmitting the converted electric power and connected in parallel to the electric power converter;
    a temperature sensor connected to at least one of the plurality of first electric power transmission members; and
    a first controller determining that at least one of the plurality of first electric power transmission members has been disconnected when a temperature detected by the temperature sensor changes.

11. The vehicle controller according to claim 10, further comprising:
    a current detector detecting a current value of a current flowing through the plurality of first electric power transmission members, and
    a storage storing a current value detected by the current detector and a predetermined first temperature threshold value, wherein
    when a current value stored in the storage is the same regardless of the elapse of time, the first controller determines that at least one of the plurality of first electric power transmission members has been disconnected when a temperature detected by the temperature sensor has changed by the first temperature threshold value or more from a temperature detected immediately before.

12. The vehicle controller according to claim 10, wherein the temperature sensor is connected to one first electric power transmission member of the plurality of first electric power transmission members and is not connected to the other first electric power transmission members.

13. The vehicle controller according to claim 10, wherein the temperature sensor is connected to each of the plurality of first electric power transmission members.

14. The vehicle controller according to claim 10, wherein the first controller stops conversion of the electric power by the electric power converter when it is determined that at least one of the plurality of first electric power transmission members has been disconnected.

15. The vehicle controller according to claim 10, wherein the first controller lowers an upper limit value of the electric power converted per unit time by the electric power converter when it is determined that at least one of the plurality of first electric power transmission members has been disconnected.

16. The vehicle controller according to claim 10, further comprising:
    a warning unit capable of warning an operator, wherein the first controller warns the operator using the warning unit when it is determined that at least one of the plurality of first electric power transmission members has been disconnected.

17. The vehicle controller according to claim 10, further comprising:
    a storage storing a predetermined second temperature threshold value, wherein
    the first controller determines that at least one of the plurality of first electric power transmission members has been disconnected when a temperature detected by the temperature sensor exceeds the second temperature threshold value.

18. An electric vehicle, comprising:
the vehicle controller according to claim 10.

19. An electric vehicle, comprising:
an electric power converter converting input electric power and outputting the converted electric power;
a plurality of first electric power transmission members transmitting the input electric power and connected in parallel to the electric power converter;
a plurality of second electric power transmission members respectively connected to portions of the plurality of first electric power transmission members different from portions thereof connected to the electric power converter;
a temperature sensor connected to at least one of the plurality of second electric power transmission members; and
a vehicle controller which determines whether or not at least one of the plurality of second electric power transmission members has been disconnected when a temperature detected by the temperature sensor changes.

20. An electric vehicle, comprising:
an electric power converter converting input electric power and outputting the converted electric power;
a plurality of first electric power transmission members transmitting the converted electric power and connected in parallel to the electric power converter;
a plurality of second electric power transmission members respectively connected to portions of the plurality of first electric power transmission members different from portions thereof connected to the electric power converter;
a temperature sensor connected to at least one of the plurality of second electric power transmission members; and
a vehicle controller which determines whether or not at least one of the plurality of second electric power transmission members has been disconnected when a temperature detected by the temperature sensor changes.

* * * * *